(12) United States Patent
Tu

(10) Patent No.: US 11,293,332 B2
(45) Date of Patent: Apr. 5, 2022

(54) VEHICLE ELECTRONIC CONTROL UNIT WATER BLOCK

(71) Applicant: Cooler Master Co., Ltd., New Taipei (TW)

(72) Inventor: Po wen Tu, New Taipei (TW)

(73) Assignee: Cooler Master Co., Ltd., Taipei (TW)

( * ) Notice: Subject to any disclaimer, the term of this patent is extended or adjusted under 35 U.S.C. 154(b) by 168 days.

(21) Appl. No.: 16/746,877

(22) Filed: Jan. 19, 2020

(65) Prior Publication Data

US 2021/0222608 A1 Jul. 22, 2021

(51) Int. Cl.
*F01P 5/12* (2006.01)
*F28F 3/04* (2006.01)
*G06F 1/20* (2006.01)

(52) U.S. Cl.
CPC ..................... *F01P 5/12* (2013.01); *F28F 3/04* (2013.01); *G06F 1/20* (2013.01); *G06F 2200/201* (2013.01)

(58) Field of Classification Search
CPC ........ F01P 5/12; F01P 3/12; F28F 3/02; F28F 3/04; F28F 3/046; F28F 3/083; F28F 2250/08; F28F 2250/10; G06F 1/20; G06F 2200/201; F28D 9/00

USPC ....................................................... 123/41.44
See application file for complete search history.

(56) References Cited

U.S. PATENT DOCUMENTS

| | | | |
|---|---|---|---|
| 2006/0007660 A1* | 1/2006 | Yatskov | H01L 23/4006 361/709 |
| 2016/0363967 A1* | 12/2016 | Tsai | H05K 7/20272 |
| 2017/0212560 A1* | 7/2017 | Tsai | F04D 1/06 |
| 2017/0245357 A1* | 8/2017 | Shih | G06F 1/20 |
| 2019/0208665 A1* | 7/2019 | Tsai | H05K 7/20263 |

* cited by examiner

*Primary Examiner* — Lindsay M Low
*Assistant Examiner* — Omar Morales

(57) ABSTRACT

A vehicle electronic control unit water block is provided. The vehicle electronic control unit water block comprises a mounting plate, cooling plate, at least one heat sink, at least one heat sink fin set, and at least one lift plate. The mounting plate and cooling plate define a cooling chamber therein having a first, second and third flow channel. The cooling liquid flows through the first and second flow channels having the at least one lift plate and at least one heat sink therein with a generally minimal and even liquid flow resistance distribution. The at least one lift plate corresponds to an elevated position of the at least one heat sink, such that the volume of cooling liquid flow is even over the lift plates and the thickness of the heat sink is minimized.

7 Claims, 14 Drawing Sheets

VEHICLE ELECTRONIC CONTROL UNIT WATER BLOCK

TECHNICAL FIELD

Example embodiments relate generally to the field of heat transfer and, more particularly, to vehicle electronic control unit water blocks.

BACKGROUND

During operation of electronic systems in vehicles, the heat generated by processors must be dissipated quickly and efficiently to keep operating temperature within manufacturer recommended ranges, under, at times, challenging operating conditions. As these electronic systems increase in functionality and applicability so does operating speed of the processors used therein; with an increase in operating speeds and an increase in the number of processors employed, power requirements of the electronic systems also increase, which in turn, increases cooling requirements.

Several techniques have been developed for extracting heat from processors in electronic systems in vehicles. One such technique is an air-cooling system, wherein a heat sink is in thermal contact with a processor and transports heat away from the processor. Additional, air, moving through segments of the heat sink, removes heat from the heat sink, helping to promote heat removal from processors. However, with higher processor speeds, increased number of processors employed, and greater heat output, this air-cooling system has become less effective. Another technique is a liquid heat exchange system, wherein cooling fluid is used to cool a processor by forcing the cooling fluid to circulate inside a closed system by a pumping unit, wherein the closed system may be a water block having one or more heat sinks thereon, in which the cooling fluid is circulated thereabout. The disposition of the one or more heat sinks is typically where the cooling fluid engages in thermal contact with the heat generating processors.

Generally, liquid heat exchange systems are more efficient than air-cooling systems. However, conventional liquid heat exchange systems consist of a water block made of one material, such as aluminum, and one or more heat sinks disposed on the water block made of another material, such as copper, which increases manufacturing steps and times for assembly, decreases manufacturing yields, and thus, increases relative costs. Moreover, mixing aluminum with copper, or a nickel plated version thereof is risky, since material mismatches will result in corrosion or the liquid heat exchange system failing to cool the processors of the vehicle electronic systems. Additionally, with spacing for mechanical or electronic components in vehicles extremely compact and limited and electronic components therein modulated, improving the thermal performance of existing vehicle liquid heat exchange systems without changing the outer dimensions thereof is challenging.

SUMMARY

Vehicle electronic control unit water blocks and water blocks are provided.

In an embodiment, a vehicle electronic control unit water block comprises a first heat sink, a second heat sink, a mounting plate, a cooling plate and at least a pump. The first heat sink is in thermal contact with a first heat sink fin set and the second heat sink is in thermal contact with a second heat sink fin set. In some embodiments, the first and second heat sinks and first and second heat sink fin sets, respectively, are integrally formed, whereby the first and second heat sink fin sets are formed by skiving. The mounting plate has an inlet cut out and an outlet cut out therethrough and a first cut out and a second cut out therethrough. When the first and second heat sinks are assembled to the mounting plate, the first and second heat sinks are secured to and the first and second heat sink fin sets protrude inwardly through the first and second cut outs, respectively. The cooling plate has a cooling chamber, a dividing wall and an outer mating surface and a third heat sink fin set and a fourth heat sink fin set thereon. The third and fourth heat sink fin sets are on opposite areas of the dividing wall and correspond to the first and second heat sink fin sets, respectively. When the mounting plate is assembled to the cooling plate, the mounting plate is secured to the outer mating surface and rests flush on the dividing wall, defining a first flow channel area, a second flow channel area and a third flow channel area of the cooling chamber. The first flow channel area is shaped like a funnel at the inlet cut out and extends to an end of the dividing wall and the first heat sink fin set and extends within the third heat sink fin set. The second flow channel area is shaped like a dogleg at the outlet cut out and extends to an end of the dividing wall and the second and fourth heat sink fin sets. The third flow channel area communicates with the first and second flow channel areas, respectively. When assembled, the at least a pump is configured to circulate a cooling liquid through the first, third and second flow channel areas via the inlet cut out and outlet cut out.

In some embodiments, the first, second, third, and fourth heat sink fin sets each comprise a plurality of longitudinal and parallel corrugations defining a plurality of heat sink fin flow channels therebetween, respectively. The first and third heat sink fin sets extend from the end of the dividing wall to a side wall of the cooling chamber of the first flow channel area. The second and fourth heat sink fin sets extend from the end of the dividing wall to a side wall of the cooling chamber of the second flow channel area.

In some embodiments, the shape of the first heat sink fin set is L-shaped and the shape of the third heat sink fin set is L-shaped. When the first heat sink fins set is assembled corresponding to the third heat sink fin set, a perpendicular end of the third heat sink fin set extends partially into the third flow channel area, whereby a cooling liquid flow distance of the third heat sink fin set is greater than a cooling liquid flow distance of the first heat sink fin set, increasing cooling liquid flow rate at an end thereof.

In some embodiments, the first and second cut outs of the mounting plate further comprise an elevated perimeter therearound, respectively, and the cooling plate further comprises a first lift plate and a second lift plate thereon. The shapes of the first and second lift plates correspond to the shapes of the first and second heat sink fin sets, respectively. The thicknesses of the first and second lift plates correspond to the elevation of the elevated perimeters of the first and second cut outs, respectively.

In some embodiments, the first and second heat sinks and first and second heat sink fin sets are formed by folding and are affixed to the first and second lift plates, respectively.

In some embodiments, the vehicle electronic control unit water block further comprises a frame, whereby the vehicle electronic control unit water block is configured to be fastened thereto.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of heatsink fins incorporating aspects of the presently disclosed principles are illustrated by way of example, and not by way of limitation.

FIG. 10 is a schematic perspective bottom view of the vehicle electronic control unit water block of FIG. 1A, according to the example embodiment.

DETAILED DESCRIPTION

The following describes various principles related to heat exchange systems by way of reference to specific examples of pumping units, fluid reservoirs, radiators, water blocks, and liquid cooling systems, including arrangements and examples of pumping units, fluid reservoirs, radiators, and water blocks embodying innovative concepts. More particularly, but not exclusively, such innovative principles are described in relation to selected examples of pumping units, fluid reservoirs, radiators, water blocks, and liquid cooling systems and well-known functions or constructions are not described in detail for purposes of succinctness and clarity. Nonetheless, one or more of the disclosed principles can be incorporated in various other embodiments of pumping units, fluid reservoirs, radiators, water blocks, and liquid cooling systems to achieve any of a variety of desired outcomes, characteristics, and/or performance criteria.

Thus, pumping units, fluid reservoirs, radiators, water blocks, and liquid cooling systems having attributes that are different from those specific examples discussed herein can embody one or more of the innovative principles, and can be used in applications not described herein in detail. Accordingly, embodiments of pumping units, fluid reservoirs, radiators, water blocks, and liquid cooling systems not described herein in detail also fall within the scope of this disclosure, as will be appreciated by those of ordinary skill in the relevant art following a review of this disclosure.

Example embodiments as disclosed herein are directed to vehicle electronic control unit water blocks. The vehicle electronic control unit water block extracts heat generated by one or more heat generating devices within an electronic system. The heat generating devices include, but are not limited to, one or more central processing units (CPU), CPU chipsets, one or more graphics processing units (GPUs), and/or one or more physics processing units (PPUs), mounted on a motherboard and/or expansion card, or the like.

The vehicle electronic control unit water block is configured to be fastened to a frame or as part of an electronic system that includes heat generating devices to be cooled in a vehicle. The vehicle electronic control unit water block includes at least one liquid-based cooling loop. Each cooling loop includes at least one fluid-to-air heat exchange area comprising at least one heat sink therein. A radiator having a built-in fluid tank can also be included in the cooling loop, depending upon application. The components in the cooling loop are coupled via a plurality of fluid conduits. Heat generated from a heat generating device is transferred to cooling liquid flowing through the at least one heat exchanger pump in the cooling loop.

Figure 1A:
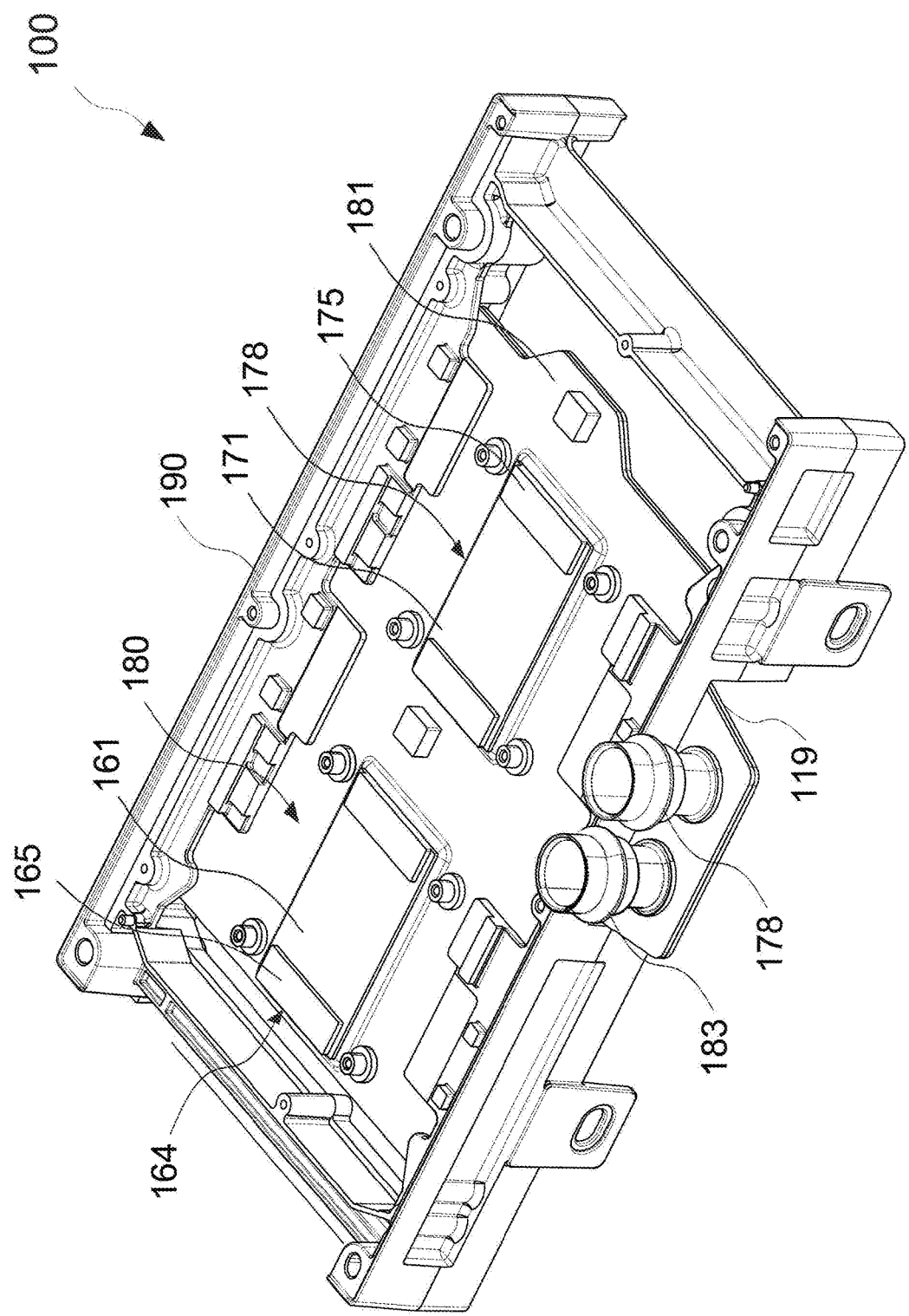
FIG. 1A is a schematic perspective view of a vehicle electronic control unit water block having a frame, according to an example embodiment.
Figure 1B:
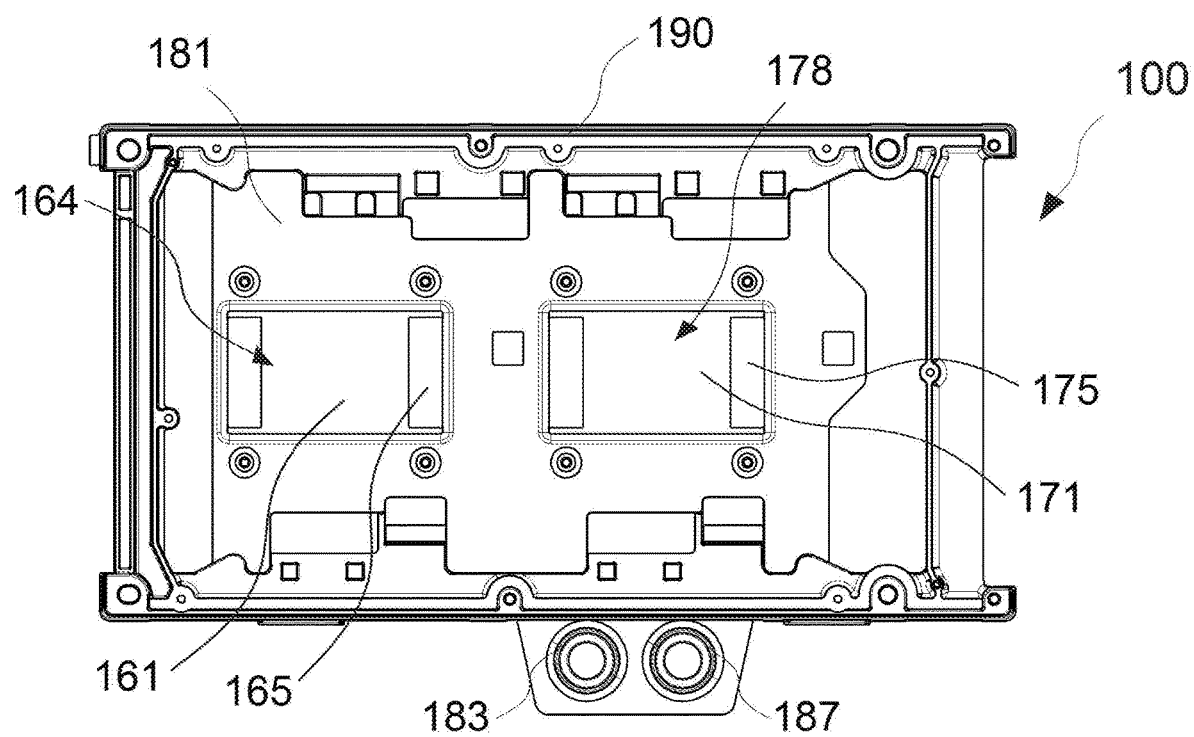
FIG. 1B is a schematic perspective top view of the vehicle electronic control unit water block of FIG. 1A, according to the example embodiment.
Figure 1C:
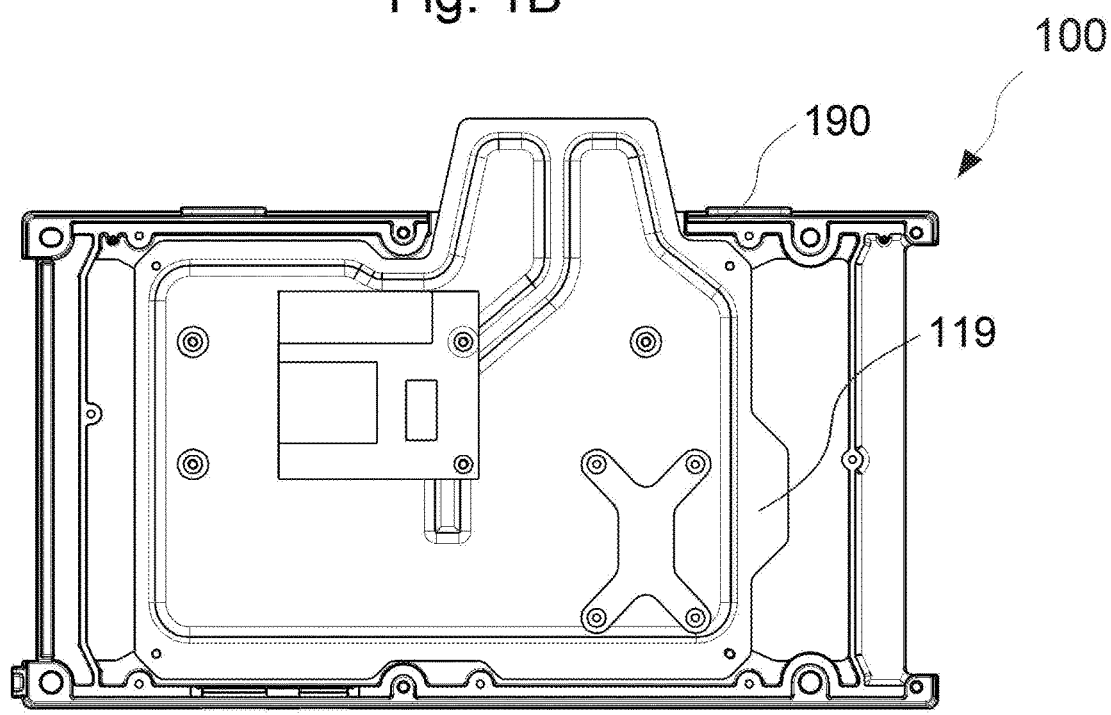
Figure 2A:
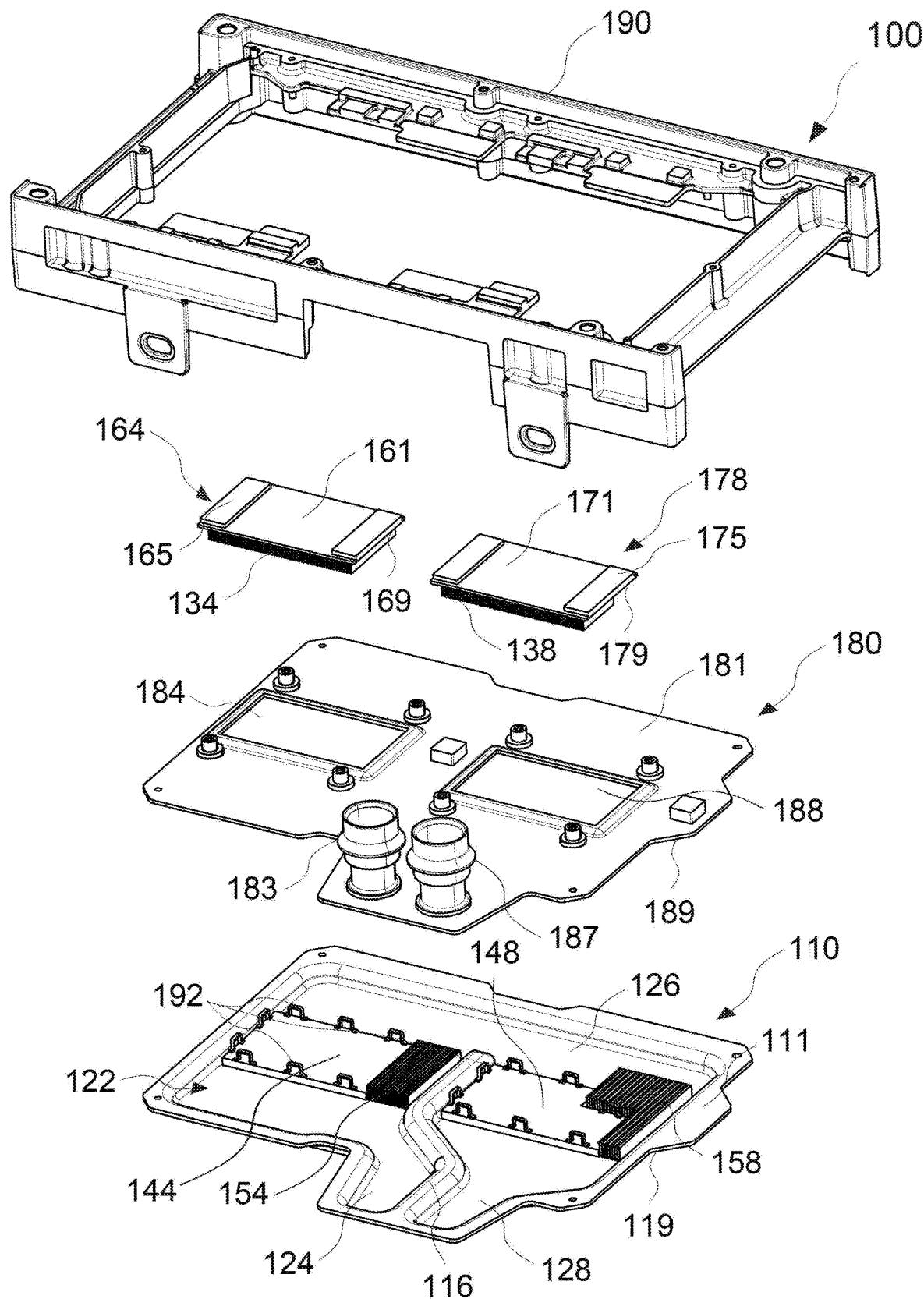
FIG. 2A is an exploded view of a vehicle electronic control unit water block having a frame, according to an example embodiment.
Figure 2B:
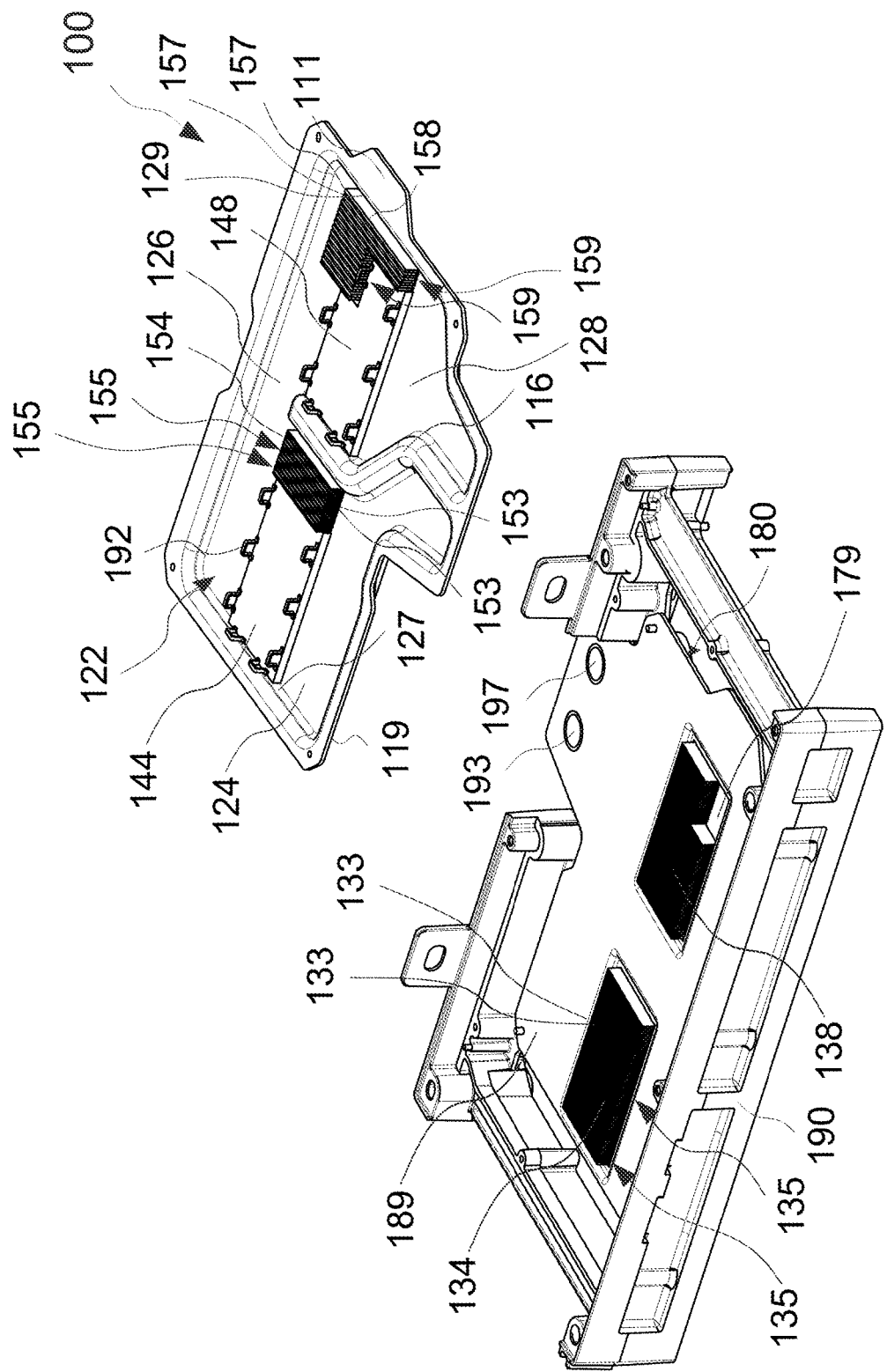
FIG. 2B is a schematic perspective view of an inner surface of a mounting plate and an inner chamber surface of a cooling plate of the vehicle electronic control unit water block of FIG. 2A, according to the example embodiment.
Figure 2C:
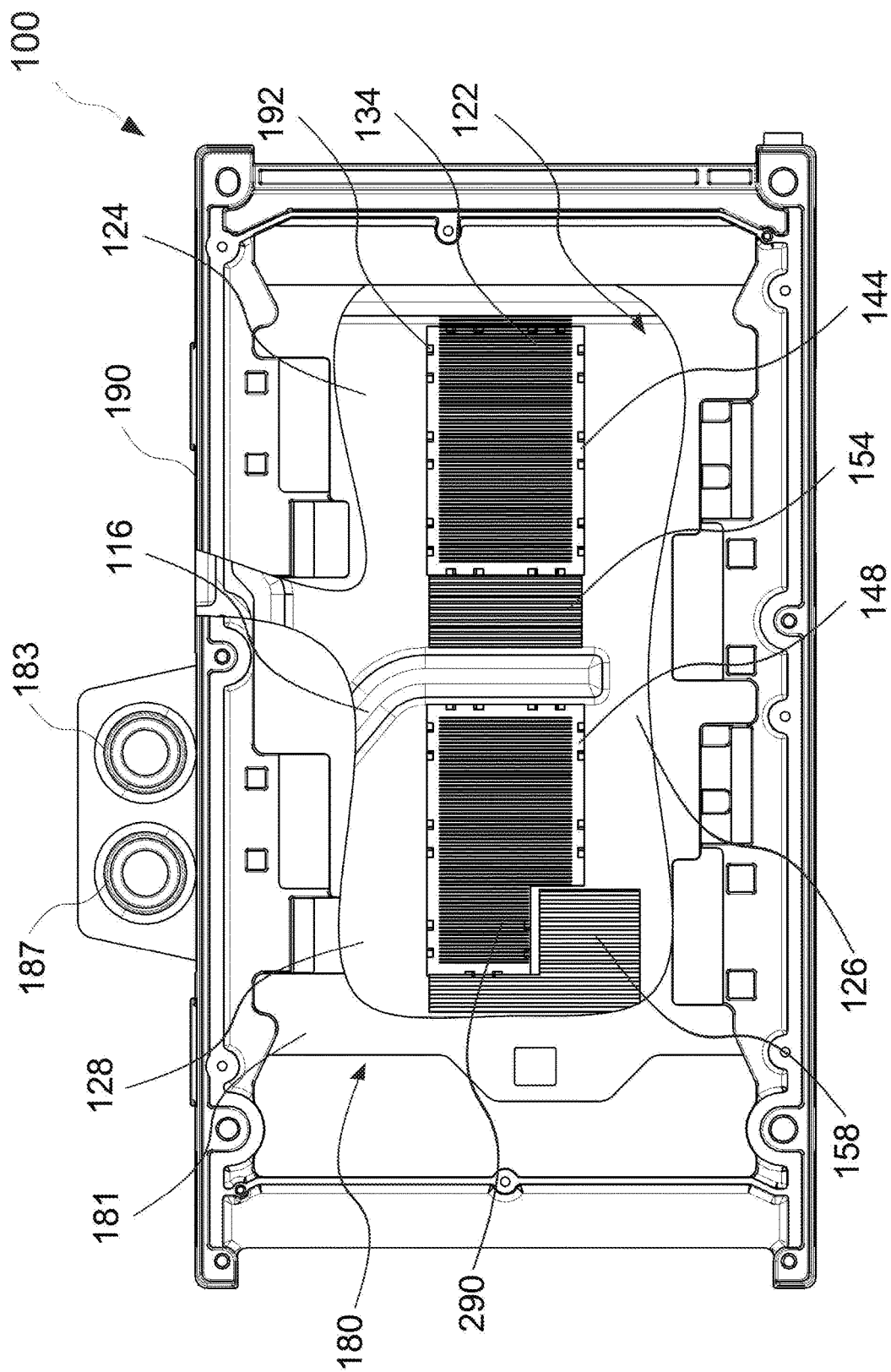
FIG. 2C illustrates a central cut-out of the interior of the vehicle electronic control unit water block of FIG. 2A, according to the example embodiment.

FIG. 1A is a schematic perspective view of a vehicle electronic control unit water block having a frame, according to an example embodiment. FIG. 1B is a schematic perspective top view of the vehicle electronic control unit water block of FIG. 1A, according to the example embodiment. FIG. 1C is a schematic perspective bottom view of the vehicle electronic control unit water block of FIG. 1A, according to the example embodiment. FIG. 2A is an exploded view of a vehicle electronic control unit water block having a frame, according to an example embodiment. FIG. 2B is a schematic perspective view of a second of a first plate and a second of a second plate of the vehicle electronic control unit water block of FIG. 2A, according to the example embodiment. FIG. 2C illustrates a central cut-out of the interior of the vehicle electronic control unit water block of FIG. 2A, according to the example embodiment. Referring to FIGS. 1A to 2C, a vehicle electronic control unit water block 100 is provided, comprising a mounting plate 180, a cooling plate 110, at least one heat sink (a first heat sink 178, and a second heat sink 164), at least one set of heat sink fin sets (a first heat sink fin set 138, a second heat sink fin set 134, a third heat sink fin set 158, and a fourth heat sink fin set 154), at least one lift plate (a first lift plate 148, and a second lift plate 144). The mounting plate 180 comprises a contact surface 181, an inner surface 189, a first cut out 188, a second cut out 184, an inlet cut out 197, and an outlet cut out 193. The cooling plate 110 comprises an outer surface 119, an inner chamber surface having an outer mating surface 111 and a cooling chamber 122, and a dividing wall 116 having a first, second and third wall portion. The mounting plate 180 is disposed generally parallel to the cooling plate 110 defining the cooling chamber 122 and resting flush on the dividing wall 116 and outer mating surface 111, where it can be watertight secured to the outer mating surface 111. The main shape of the mounting plate 180 is generally rectangular having an extended outward portion offset from a center thereof. The inlet cut out 197 and outlet cut out 193 are positioned within the extended outward portion and the shape of the mounting plate 180 is generally the same shape as that of the cooling chamber 122.

In an embodiment, the cooling plate 110 further comprises a first flow channel area 128, a second flow channel area 124, and a third flow channel area 126. The first wall portion of the dividing wall 116 is positioned centrally within the extended outward portion of the cooling chamber 122, as a first part of a divider, dividing the cooling chamber into the first flow channel area 128 and second flow channel area 124. The second wall portion of the dividing wall 116 then angles toward a center of the mounting plate 180 and cooling chamber 122, as a second part of the divider, dividing the cooling chamber into the first flow channel area 128 and second flow channel area 124. The third wall portion of the dividing wall 116, at about one-third a width length of the mounting plate 180 and cooling chamber 122, then angles back to a position in a parallel plane with the first wall portion, as a third part of the divider, dividing the cooling chamber into the first flow channel area 128 and second flow channel area 124. An end of the third wall portion of the dividing wall 116 opposite an end of the first wall portion of the dividing wall 116 does not extend to a side of the mounting plate 180 and cooling chamber 122 opposite the first wall portion. The third flow channel area 126 is a generally rectangular area between the end of the third wall portion and side of the mounting plate 180 and cooling chamber 122 opposite the first wall portion and U-shaped walls theresurrounding. In addition to defining the third flow channel area 126 and separating the first flow channel area 128 from the second flow channel area 124, the dividing wall 116 also supports the mounting plate 180 at a central portion of the vehicle electronic control unit water block 100, preventing collapsing thereof and eliminating the need for separate supporting structures.

In an embodiment the first lift plate 148 and third heat sink fin set 158 are disposed in the first flow channel area 128. The second lift plate 144 and fourth heat sink fin set 154 are disposed in the second flow channel area 124. The third heat sink fin set 158 is generally L-shaped with a longitudinal side of the L-shape, parallel with and flush with a side wall of the cooling chamber 122 and a perpendicular end extending partially into the third flow channel area 126. The first lift plate 148 is generally L-shaped and corresponding to the L-shaped third heat sink fin set 158, forming a generally L-shape. An end of the first lift plate 148, opposite the corresponding end with the L-shaped third heat sink fin set 158, is parallel with and is flush with the third wall portion of the dividing wall 116 having a width generally the same as that with the length of the third wall portion. The fourth heat sink fin set 154 is rectangular-shaped with a longitudinal side of the rectangular-shape parallel with and flush with the third wall portion of the dividing wall 116 having a width generally the same as that with the length of the third wall portion. The second lift plate 144 is rectangular-shaped and corresponding to the rectangular-shaped fourth heat sink fin set 154, forming a generally rectangular shape. An end of the second lift plate 144, opposite the corresponding end with the rectangular-shaped fourth heat sink fin set 154, is parallel with and is flush with a side wall of the cooling chamber 122 opposite the side with the rectangular-shaped fourth heat sink fin set 154. The third flow channel area 126 communicates with both the first and second flow channel areas 128, 124.

In an embodiment the first lift plate 148 and third heat sink fin set 158 are disposed in the first flow channel area 128. The second lift plate 144 and fourth heat sink fin set 154 are disposed in the second flow channel area 124. The third heat sink fin set 158 is generally L-shaped with a longitudinal side of the L-shape, parallel with and flush with a side wall 129 of the cooling chamber 122 and a perpendicular end extending partially into the third flow channel area 126. The first lift plate 148 is generally L-shaped and corresponding to the L-shaped third heat sink fin set 158, forming a generally L-shape. An end of the first lift plate 148, opposite the corresponding end with the L-shaped third heat sink fin set 158, is parallel with and is flush with the third wall portion of the dividing wall 116 having a width generally the same as that with the length of the third wall portion. The fourth heat sink fin set 154 is rectangular-shaped with a longitudinal side of the rectangular-shape parallel with and flush with the third wall portion of the dividing wall 116 having a width generally the same as that with the length of the third wall portion. The second lift plate 144 is rectangular-shaped and corresponding to the rectangular-shaped fourth heat sink fin set 154, forming a generally rectangular shape. An end of the second lift plate 144, opposite the corresponding end with the rectangular-shaped fourth heat sink fin set 154, is parallel with and is flush with a side wall 127 of the cooling chamber 122 opposite the side with the rectangular-shaped fourth heat sink fin set 154. The third flow channel area 126 communicates with both the first and second flow channel areas 128, 124.

The vehicle electronic control unit water block 100 further comprises a cooling liquid inlet 187 and a cooling liquid outlet 183, watertight fastened to the inlet cut out 197 and outlet cut out 193 of the mounting plate 180, respectively. The cooling liquid inlet 187 and cooling liquid outlet 183 are in communication with the first flow channel area 128 and second flow channel area 124, respectively, and defines a passage for cooling liquid to travel throughout the vehicle electronic control unit water block 100, first via the cooling liquid inlet 187, then throughout the first flow channel area 128 and into the third flow channel area 126, and then throughout the second flow channel area 124, and then back out the cooling liquid outlet 183.

Figure 3A:
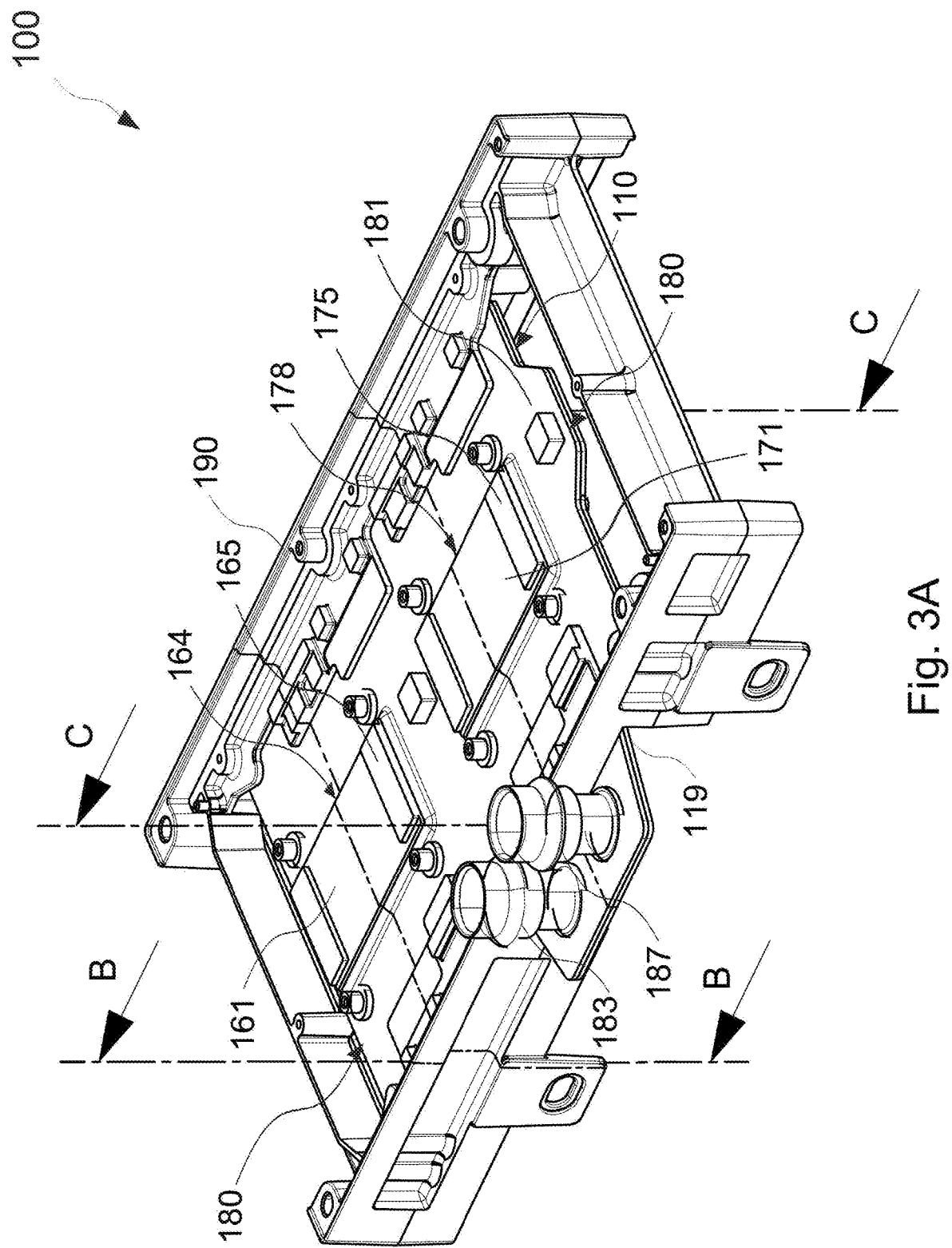
FIG. 3A is a schematic perspective view of a vehicle electronic control unit water block having a frame with line B-B and line C-C, according to an example embodiment.
Figure 3B:
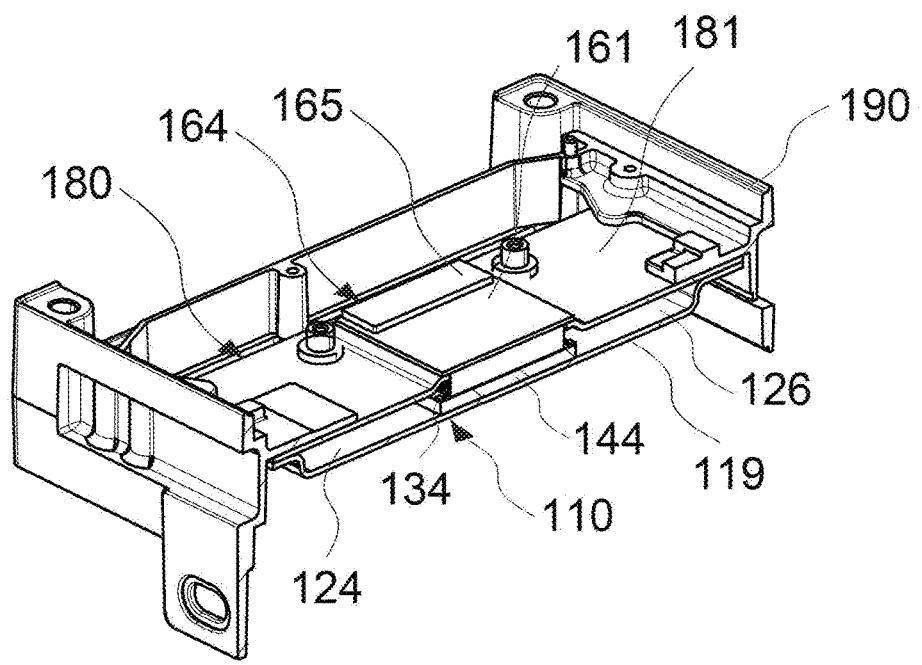
FIG. 3B is a schematic cross-sectional view of the vehicle electronic control unit water block of FIG. 3A along line B-B in FIG. 3A, according to the example embodiment.
Figure 3C:
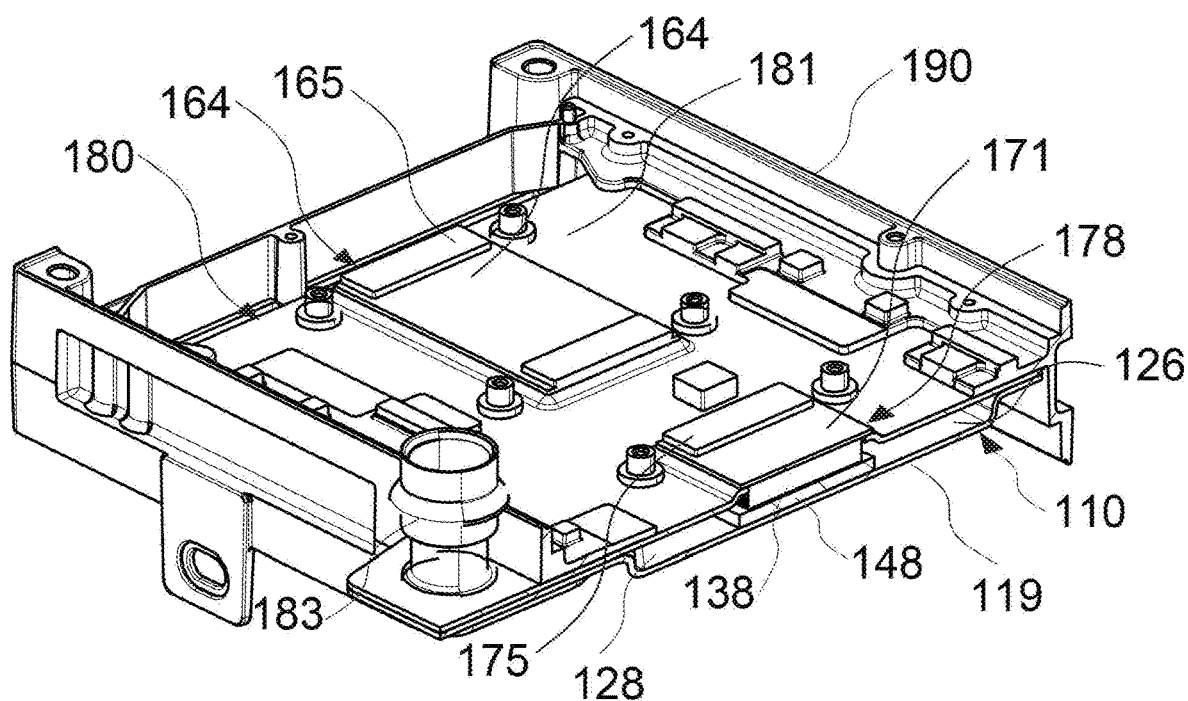
FIG. 3C is a schematic cross-sectional view of the vehicle electronic control unit water block of FIG. 3A along line C-C in FIG. 3A, according to the example embodiment.
Figure 4A:
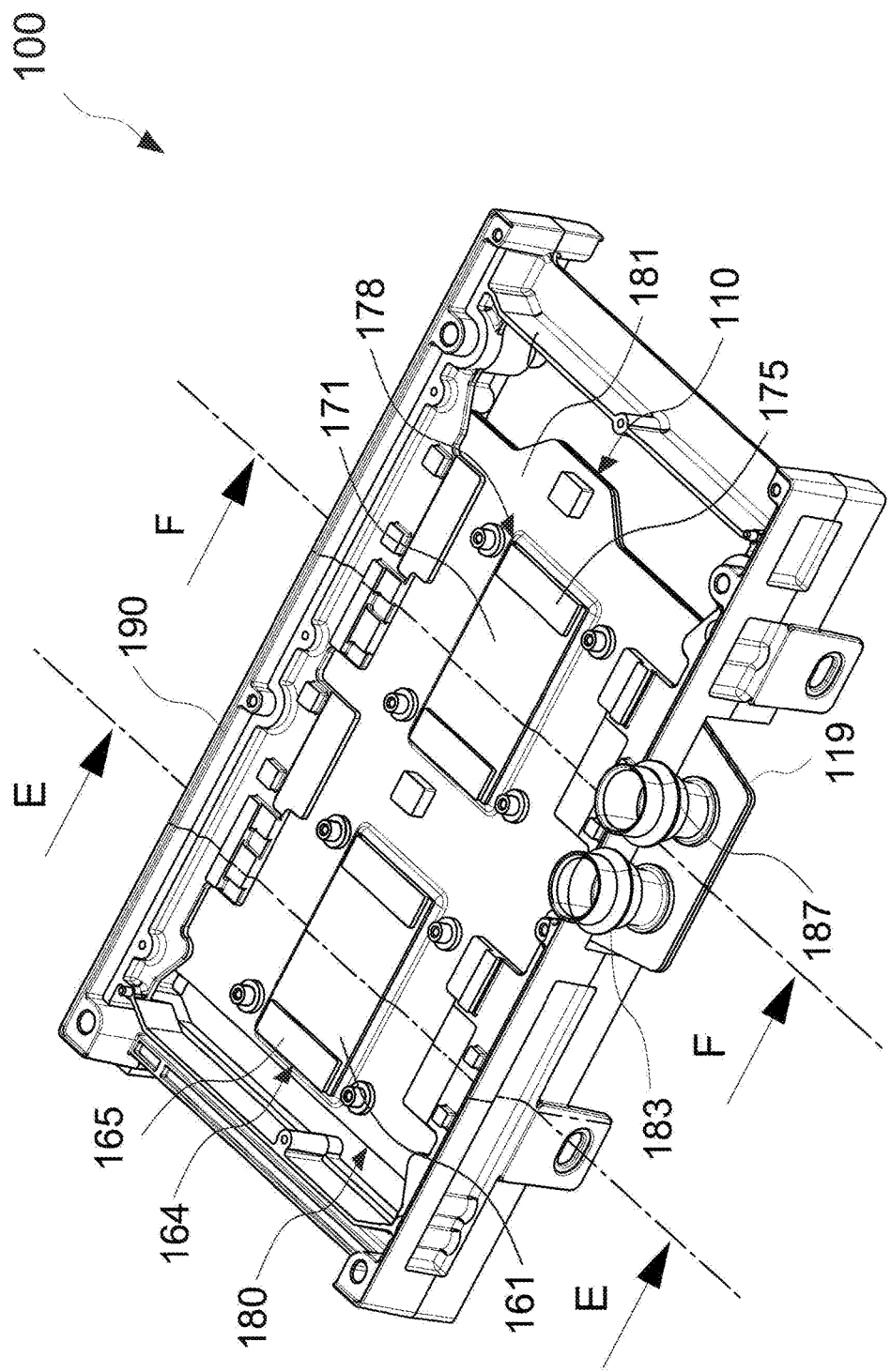
FIG. 4A is a schematic perspective view of a vehicle electronic control unit water block having a frame with line E-E and line F-F, according to an example embodiment.
Figure 4B:
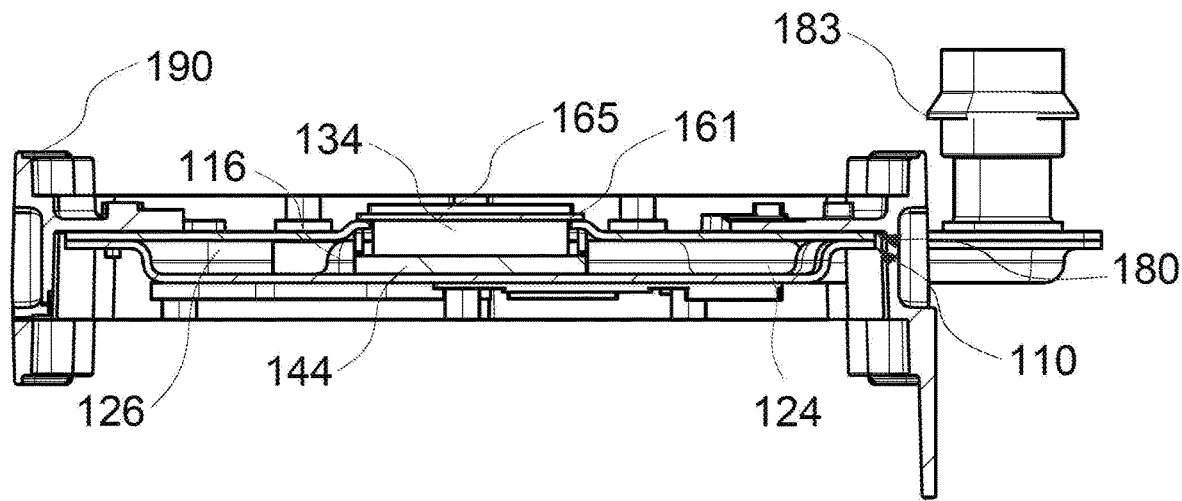
FIG. 4B is a schematic cross-sectional view of the vehicle electronic control unit water block of FIG. 4A along line E-E in FIG. 4A, according to the example embodiment.
Figure 4C:
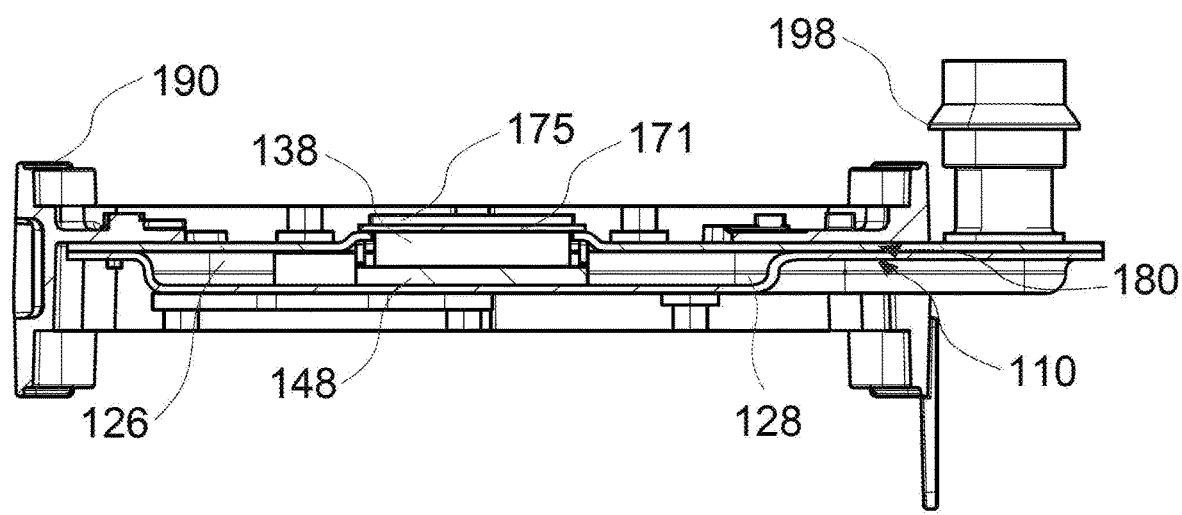
FIG. 4C is a schematic cross-sectional view of the vehicle electronic control unit water block of FIG. 4A along line F-F in FIG. 4A, according to the example embodiment.

FIG. 3A is a schematic perspective view of a vehicle electronic control unit water block having a frame with line B-B and line C-C, according to an example embodiment. FIG. 3B is a schematic cross-sectional view of the vehicle electronic control unit water block of FIG. 3A along line B-B in FIG. 3A, according to the example embodiment. FIG. 3C is a schematic cross-sectional view of the vehicle electronic control unit water block of FIG. 3A along C-C in FIG. 3A, according to the example embodiment. FIG. 4A is a schematic perspective view of a vehicle electronic control unit water block having a frame with line E-E and line F-F, according to an example embodiment. FIG. 4B is a schematic cross-sectional view of the vehicle electronic control unit water block of FIG. 4A along line E-E in FIG. 4A, according to the example embodiment. FIG. 4C is a schematic cross-sectional view of the vehicle electronic control unit water block of FIG. 4A along line F-F in FIG. 4A, according to the example embodiment. Referring to FIGS. 3A to 4C, and referring to FIGS. 1A to 2C, a conduit (not shown) is affixed to the cooling liquid inlet 187 and provides cooling liquid to the vehicle electronic control unit water block 100 to begin a cooling liquid flow therethrough. The first flow channel 128 comprises a funnel-like flow channel at the cooling liquid inlet 187 within the extended outward portion of the cooling chamber 122. The funnel-like flow channel allows for increased flow rate of the cooling liquid at the beginning of the cooling liquid flow, which is beneficial to heat exchange of the vehicle electronic control unit water block 100. Following, the cooling liquid flows through the L-shaped third heat sink fin set 158 and corresponding L-shaped first heat sink fin set 138 to enter the third flow channel area 126. The flow distance of the third heat sink fin set 158 is greater than the flow distance of the first heat sink fin set 138 for a generally minimal and even liquid flow resistance distribution through the first and third heat sink fin sets 138, 158 to the third flow channel area 126. Next, the cooling liquid flows from the third flow channel area 126 to the second flow channel area 124, by first flowing through the rectangular-shaped second heat sink fin set 134 and corresponding rectangular-shaped fourth heat sink fin set 154. The flow distance of the second heat sink fin set 134 is generally the same as the flow distance of the fourth heat sink fin set 154 for a generally minimal and even liquid flow resistance distribution through the second and fourth heat sink fin sets 134, 154, to a dogleg flow channel at the cooling liquid outlet 183. With the cooling liquid flowing through the heat sink fin sets, surface area for heat exchange is increased and low thermal resistance from the heat sink fin sets to the heat sink is achieved, thus, improving heat exchange of the vehicle electronic control unit water block 100. The cooling liquid then flows out of the cooling liquid outlet 183 via a conduit (not shown) to, as an example, and not to be limiting, a pumping unit (not shown), and then back to the vehicle electronic control unit water block 100 to start the cooling liquid flow process again.

In an embodiment, the first and second lift plates 148, 144, are designed to correspond with an elevated perimeter of the first and second cut outs 188, 184 of the mounting plate 180 and corresponding first and second heat sinks 178, 164 assembled thereto, such that the volume of cooling liquid flow generally remains even prior to, over, and after the first and second lift plates 148, 144 without negatively affecting the liquid flow through the first, second, third, and fourth heat sink fin sets 138, 134, 158, 154, respectively. Generally, the thickness of the first and second lift plates 148, 144 is equal to the elevated perimeter of the first and second cut outs 188, 184. Further, due to the first and second lift plates 148, 144 and elevated position of the first and second heat sinks 178, 164, the thickness of the first and second heat sinks 178, 164 is decreased, increasing heat exchange with the cooling liquid flow whilst not changing the outer dimensions of the vehicle electronic control unit water block 100. Given the increased heat exchange, aluminum heat sinks are employed, decreasing manufacturing issues with material mismatch with copper heat sinks and thus, decreasing the manufacturing steps, costs, and time for manufacturing of the vehicle electronic control unit water block 100, and increasing manufacturing yields, without sacrificing thermal performance.

In an embodiment, the first and second lift plates 148, 144, are designed to correspond with an elevated perimeter of the first and second cut outs 188, 184 of the mounting plate 180 and corresponding first and second heat sinks 178, 164 assembled thereto, such that the volume of cooling liquid flow generally remains even prior to, over, and after the first and second lift plates 148, 144 without negatively affecting the liquid flow through the plurality of heat sink fin flow channels 139, 135, 159, 155 defined by the plurality of longitudinal and parallel corrugations 137, 133, 157, 153 of the first, second, third, and fourth heat sink fin sets 138, 134, 158, 154, respectively. Generally, the thickness of the first and second lift plates 148, 144 is equal to the elevated perimeter of the first and second cut outs 188, 184. Further, due to the first and second lift plates 148, 144 and elevated position of the first and second heat sinks 178, 164, the thickness of the first and second heat sinks 178, 164 is decreased, increasing heat exchange with the cooling liquid flow whilst not changing the outer dimensions of the vehicle electronic control unit water block 100. Given the increased heat exchange, aluminum heat sinks are employed, decreasing manufacturing issues with material mismatch with copper heat sinks and thus, decreasing the manufacturing steps, costs, and time for manufacturing of the vehicle electronic control unit water block 100, and increasing manufacturing yields, without sacrificing thermal performance.

In some embodiments, the first and second heat sink fin sets 138, 134 are manufactured by skiving; whereby a knife tool shaves the heat sink fins up from an extruded aluminum base. A high fin-to-gap aspect ratio is achieved, increasing surface area and improving thermal performance. However, the embodiments are not limited thereto. In alternative embodiments, the first and second heat sink fin sets 138, 134 can be manufactured by other means, such as extrusion, stamping, forging, casting, brazing, assembling or machining, bonding, or folding, or other means known to those of ordinary skill in the art and the embodiments are not limited thereto. Also, depending on the manufacturing method, the first and second heat sink fin sets 138, 134 can be a part of the first and second heat sinks 178, 164, or separated, and be of different shapes or geometries, and the embodiments are not limited thereto. So long as a generally minimal and even liquid flow resistance distribution through the heat sink fin sets and low thermal resistance from the heat sink fin sets to the heat sink are achieved and corrosion due to material mismatch is avoided.

Figure 5A:
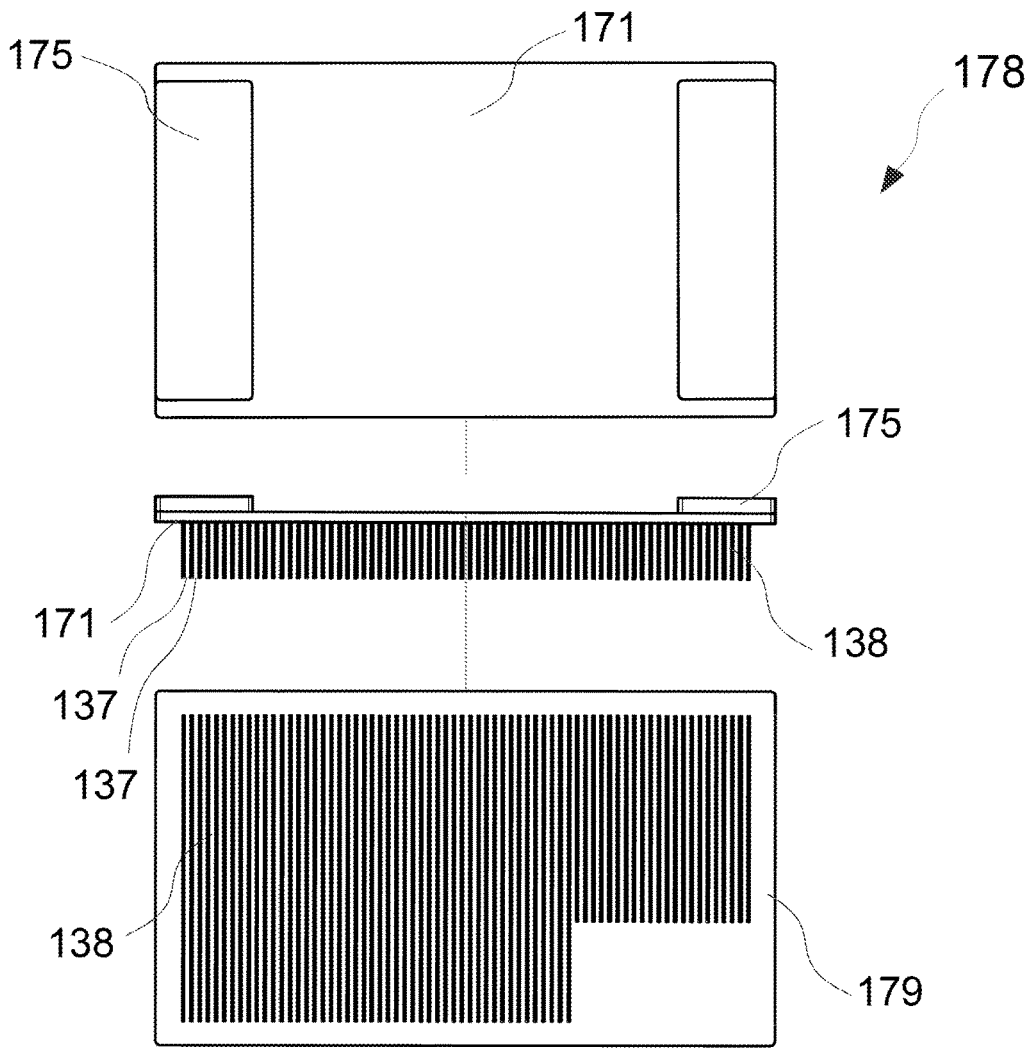
FIG. 5A is schematic prospective views of a second heat sink of a vehicle electronic control unit water block, according to an example embodiment.
Figure 5B:
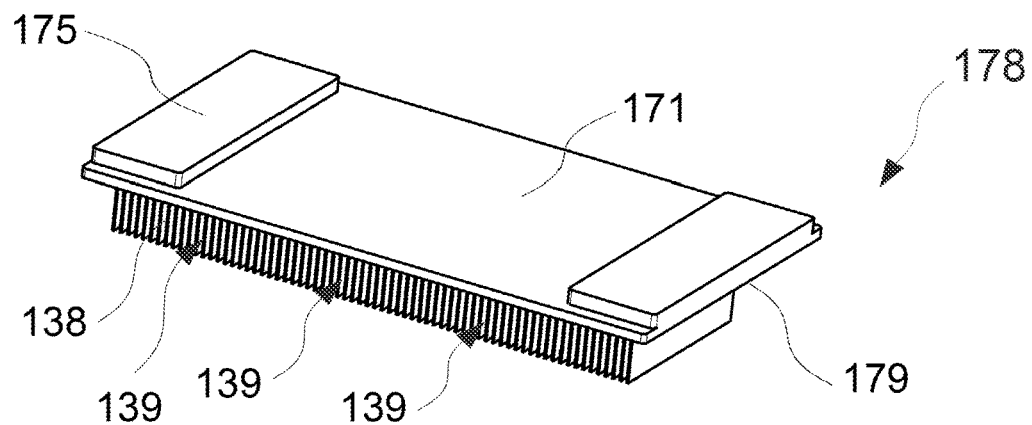
FIG. 5B is another schematic prospective view of FIG. 5A, according to the example embodiment.
Figure 6A:
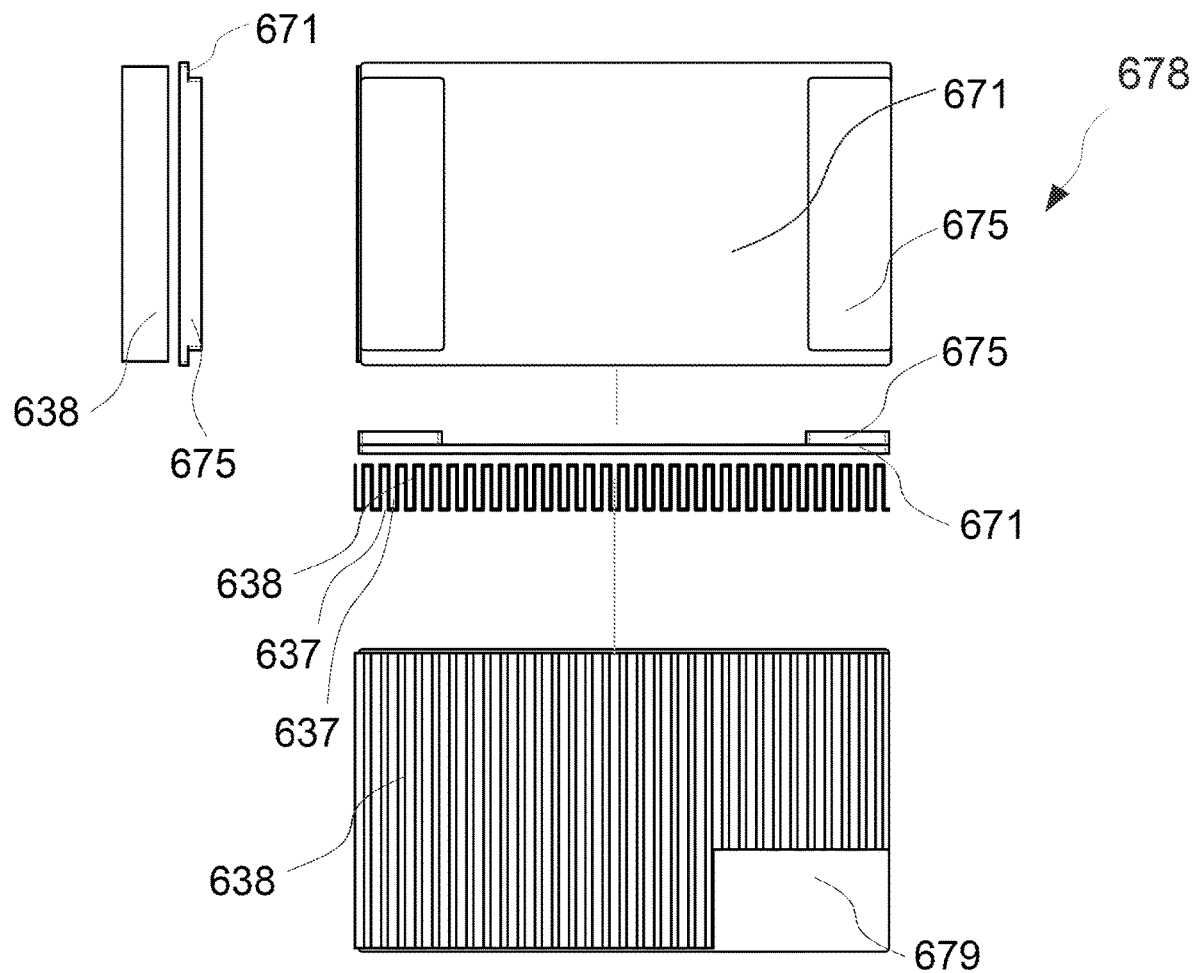
FIG. 6A is schematic prospective views of an alternative second heat sink of a vehicle electronic control unit water block, according to an example embodiment.
Figure 6B:
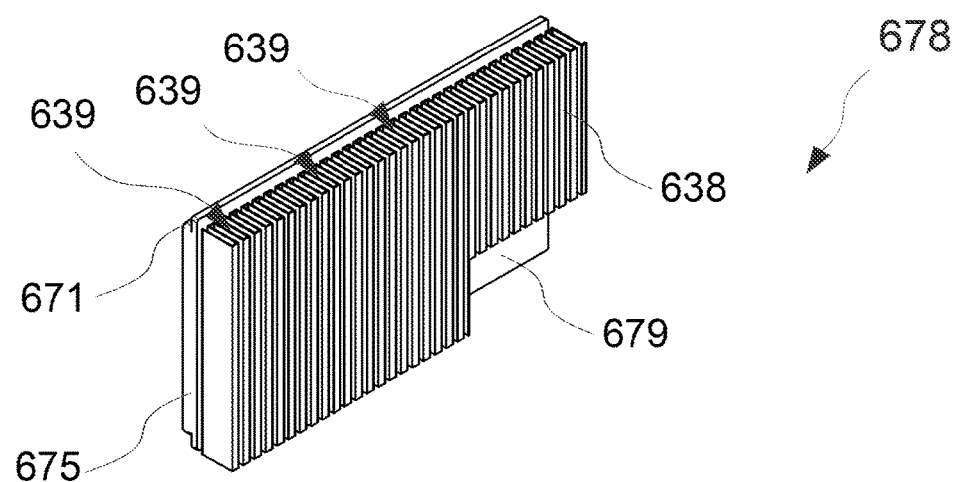
FIG. 6B is another schematic prospective view of FIG. 6A, according to the example embodiment.
Figure 7A:
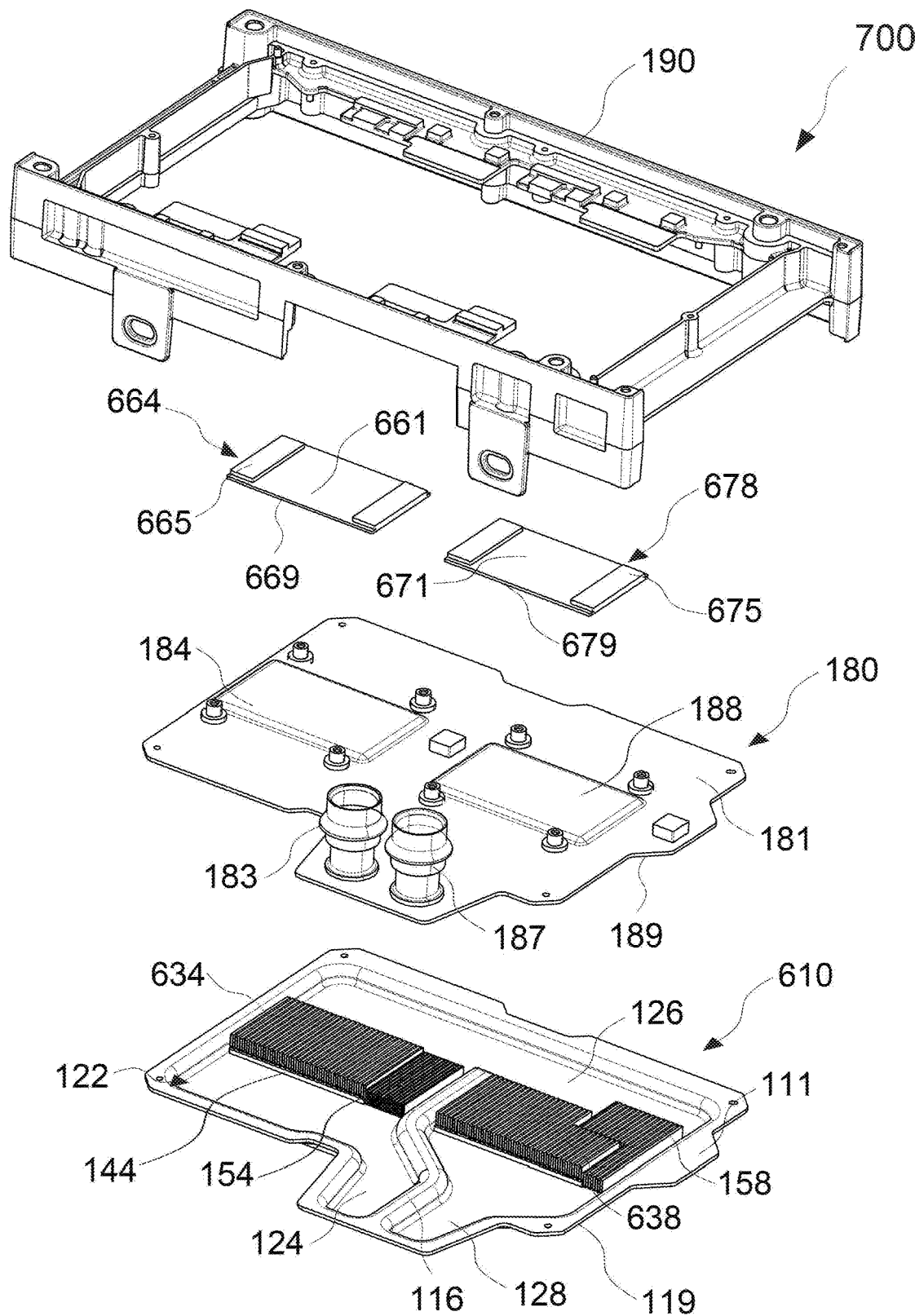
FIG. 7A is an exploded view of an alternative vehicle electronic control unit water block having a frame, according to an example embodiment.
Figure 7B:
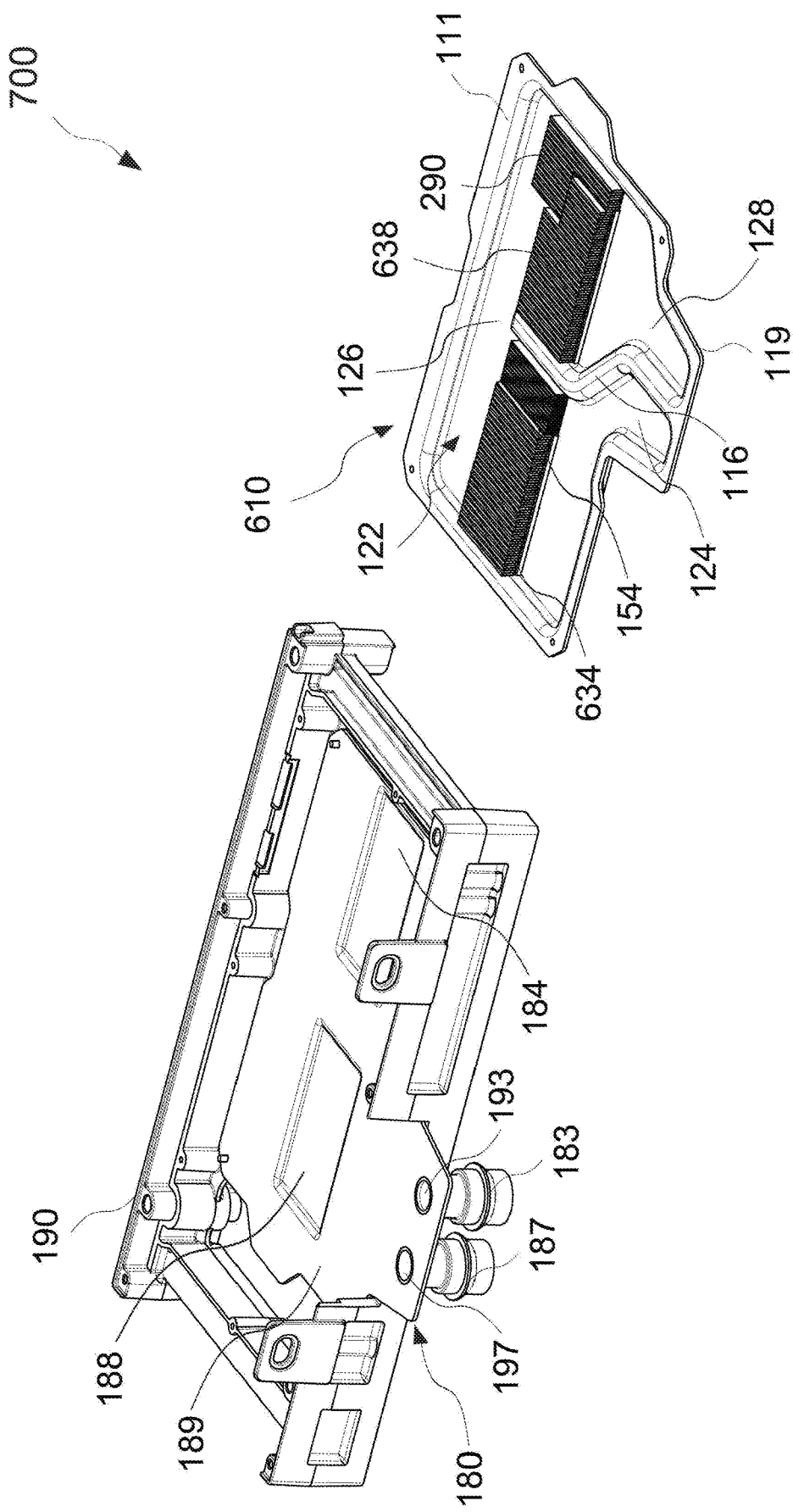
FIG. 7B is a schematic perspective view of an inner surface of a mounting plate and an inner chamber surface of the alternative vehicle electronic control unit water block of FIG. 7A, according to the example embodiment.
Figure 7C:
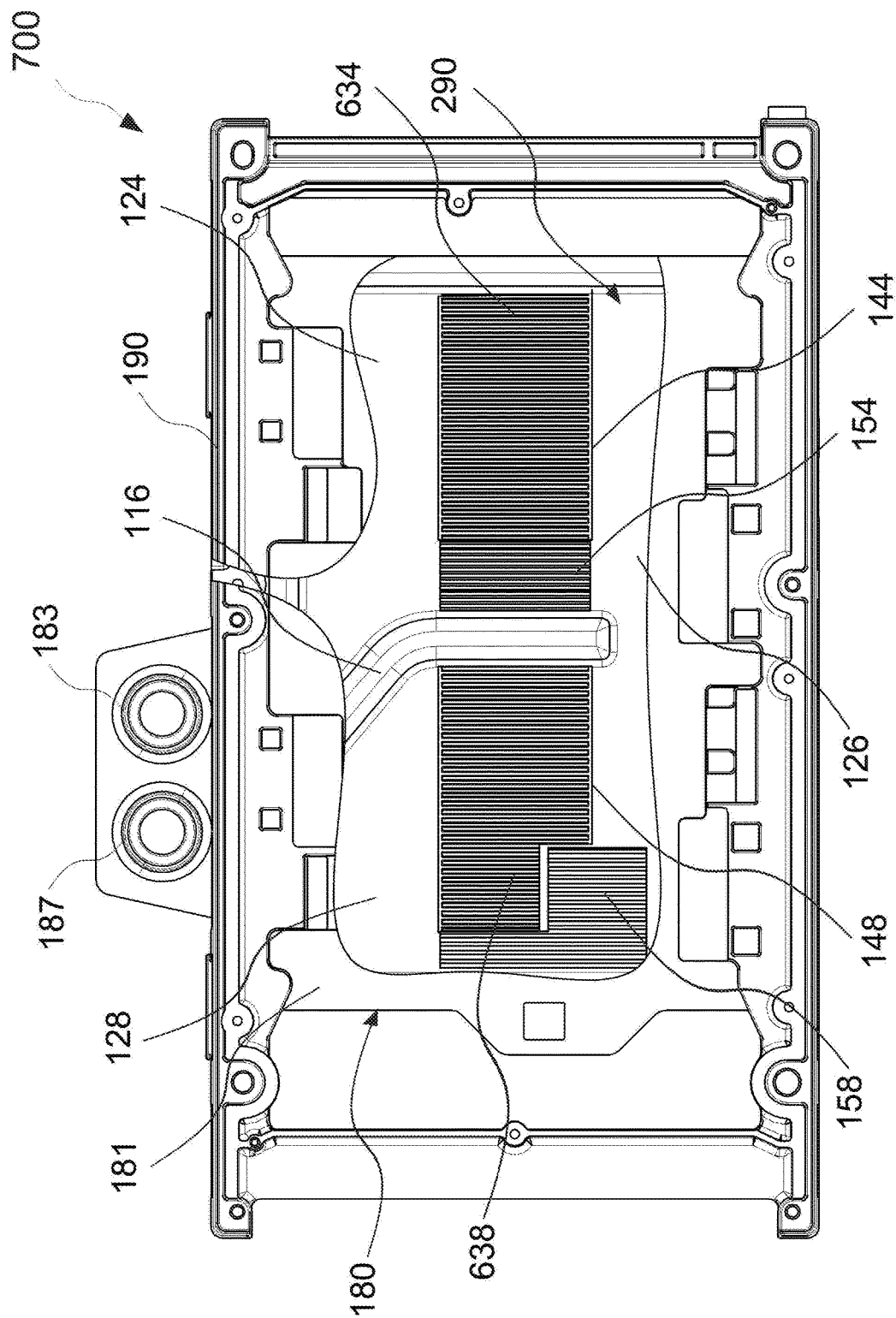
FIG. 7C illustrates a central cut out of the interior of the vehicle electronic control unit water block of FIG. 7A, according to the example embodiment.

FIG. 5A is schematic prospective views of a second heat sink of a vehicle electronic control unit water block, according to an example embodiment. FIG. 5B is another schematic prospective view of FIG. 5A, according to the example embodiment. FIG. 6A is schematic prospective views of an alternative second heat sink of a vehicle electronic control unit water block, according to an example embodiment. FIG. 6B is another schematic prospective view of FIG. 6A, according to the example embodiment. FIG. 7A is an exploded view of an alternative vehicle electronic control unit water block having a frame, according to an example embodiment. FIG. 7B is a schematic perspective view of an inner surface of a mounting plate and an inner chamber surface of the alternative vehicle electronic control unit water block of FIG. 7A, according to the example embodiment. FIG. 7C illustrates a central cut out of the interior of the vehicle electronic control unit water block of FIG. 7A, according to the example embodiment. Referring to FIGS. 5A and 5B, and referring to FIGS. 1A to 4C, the manufacturing method of the first and second heat sink fin sets 138, 134 are by skiving. Thus, the first and second heat sink fin sets 138, 134 are a part of the first and second heat sinks 178, 164. However, referring to FIGS. 6A and 6B, and referring to FIGS. 7A to 7C, the manufacturing method of the first and second heat sink fin sets 638, 634 are by folding. Thus, the first and second heat sink fin sets 638, 634 are not a part of the first and second heat sinks 678, 664. In an embodiment, the first and second heat sink fin sets 638, 634 are affixed to the first and second lift plates 148, 144, respectively, by epoxy or a brazing technique. Accordingly, the vehicle electronic control unit water block 700 does not further comprise a plurality of brackets 192 for fixing of the first and second heat sink fin sets 638, 634. The folded heat sink fin sets also allow for a high fin-to-gap aspect ratio and thin fins, thus, also increasing surface area and improving thermal performance.

FIG. 5A is schematic prospective views of a second heat sink of a vehicle electronic control unit water block, according to an example embodiment. FIG. 5B is another schematic prospective view of FIG. 5A, according to the example embodiment. FIG. 6A is schematic prospective views of an alternative second heat sink of a vehicle electronic control unit water block, according to an example embodiment. FIG. 6B is another schematic prospective view of FIG. 6A, according to the example embodiment. FIG. 7A is an exploded view of an alternative vehicle electronic control unit water block having a frame, according to an example embodiment. FIG. 7B is a schematic perspective view of an inner surface of a mounting plate and an inner chamber surface of the alternative vehicle electronic control unit water block of FIG. 7A, according to the example embodiment. FIG. 7C illustrates a central cut out of the interior of the vehicle electronic control unit water block of FIG. 7A, according to the example embodiment. Referring to FIGS. 5A and 5B, and referring to FIGS. 1A to 4C, the manufacturing method of the first and second heat sink fin sets 138, 134 are by skiving, forming the plurality of longitudinal and parallel corrugations 137 defining the plurality of heat sink fin flow channels 139. Thus, the first and second heat sink fin sets 138, 134 are a part of the first and second heat sinks 178, 164. However, referring to FIGS. 6A and 6B, and referring to FIGS. 7A to 7C, the manufacturing method of the first and second heat sink fin sets 638, 634 are by folding, forming the plurality of longitudinal and parallel corrugations 637 defining the plurality of heat sink fin flow channels 639. Thus, the first and second heat sink fin sets 638, 634 are not a part of the first and second heat sinks 678, 664. In an embodiment, the first and second heat sink fin sets 638, 634 are affixed to the first and second lift plates 148, 144, respectively, by epoxy or a brazing technique. Accordingly, the vehicle electronic control unit water block 700 does not further comprise a plurality of brackets 192 for fixing of the first and second heat sink fin sets 638, 634. The folded heat sink fin sets also allow for a high fin-to-gap aspect ratio and thin fins, thus, also increasing surface area and improving thermal performance.

In an embodiment, the vehicle electronic control unit water block 100 is configured to be fastened to a frame 190 via fasteners, such as anti-vibration rivets, anti-vibration bolts, and anti-vibration screws, minimizing vibration during operation; however, the embodiments are not limited thereto. Other fastening means can be used as long as the vehicle electronic control unit water block 100 can be securely fastened to the frame 190 and the type of material used for the fasteners do not result in corrosion due to material mismatches. In the embodiments, both the vehicle electronic control unit water block 100 and frame 190 are made of aluminum. The shape of the frame is quadrilateral and the frame 190 and comprises inner extensions for secure mounting of the vehicle electronic control unit water block 100 thereto. In some embodiments, the vehicle electronic control unit water block 100 is generally rectangular-shaped; however, those of ordinary skill in the relevant art may readily appreciate that the main shape of the mounting plate 180 and cooling chamber 122 can be a shape other than generally rectangular-shaped, so long as the vehicle electronic control unit water block 100 can be firmly secured in the frame 190.

The at least one heat exchanger pump and plurality of fluid conduits, which are possibly manufactured from a plastic material, may be "metalized" in order to minimize fluid diffusion or evaporation of the fluid. The metal may be provided as a thin layer of metal coating provided on either or on both of the internal side or the external side of the plastic part. Generally, the same metal material is used throughout the cooling loop, such as, aluminum. The plurality of fluid conduits may be flexible and/or rigid.

The cooling liquid of the vehicle electronic control unit water block may be any type of cooling liquid such as water, water with additives such as anti-fungicide, water with additives for improving heat conducting or other special compositions of cooling liquids such as electrically non-conductive liquids or liquids with lubricant additives or anti-corrosive additives, so long as the cooling liquid promotes cooling in the cooling loop and does not promote corrosion therein.

Control of the at least one heat exchanger pump driven by an AC or DC electrical motor, preferably takes place by means of an operative system or like means of an electronic system itself, wherein the electronic system comprises a means for measuring load and/or temperature of one or more processors. Using the measurement performed by the operative system or a like system eliminates the need for special means for operating the pump. Communication between the operative system or a like system and a processor for operating the pump may take place along already established communication links. Thereby, a real-time communication between the liquid cooling system and the vehicle electronic control unit water block may be provided without any special means for establishing the communication.

In some embodiments, the vehicle electronic control unit water block is configured to cool each heat generating device included within a frame or electronic system. In alternative embodiments, the vehicle electronic control unit water block is configured to cool only select heat generating devices, or only a single heat generating device, while other heat generating devices are left to be cooled by other or complimentary means.

In the embodiments, a vehicle electronic control unit water block is provided. The vehicle electronic control unit water block comprises a mounting plate, cooling plate, at least one heat sink, at least one heat sink fin set, and at least one lift plate. The mounting plate and cooling plate define a cooling chamber therein having a first, second and third flow channel. The cooling liquid flows through the first and second flow channels having the at least one lift plate and at least one heat sink therein with a generally minimal and even liquid flow resistance distribution. The at least one lift plate corresponds to an elevated position of the at least one heat sink, such that the volume of cooling liquid flow, generally, remains even over the lift plates and the thickness of the heat sink is minimized.

The cooling liquid flowing through the vehicle electronic control unit water block is optimized by the funnel-like flow channel at the cooling liquid inlet, leading to a generally minimal and even liquid flow resistance distribution of the heat sink fin sets, to the third flow channel area communicating with the second flow channel area. The cooling liquid then flows through the second flow channel area, also with a generally minimal and even liquid flow resistance distribution of heat sink fin sets, to the dogleg flow channel at the cooling liquid outlet of the vehicle electronic control unit water block, to a pumping unit and then back to the vehicle electronic control unit water block to start the cooling liquid flow process again. In addition to the optimized flow channel of the vehicle electronic control unit water block, the lift plates are designed to correspond with the elevated position of the heat sinks, such that the volume of cooling liquid flow, generally, remains even over the lift plates without negatively affecting the liquid flow through the heat sink fin sets, thus, keeping heat transfer flow the same. With the heat sinks now elevated and heat transfer flow the same, the thickness of the heat sinks is decreased, and thus, heat exchange with the cooling liquid flow is now increased whilst not changing the outer dimensions of the vehicle electronic control unit water block (height or thickness, from a side view). Given the increased heat exchange, aluminum heat sinks are employed, decreasing manufacturing issues with material mismatch with copper heat sinks and thus, decreasing the manufacturing steps, costs, and time for manufacturing of the vehicle electronic control unit water block, increasing manufacturing yields, whilst not sacrificing heat dissipation performance.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A vehicle electronic control unit water block, comprising:
    a first heat sink in thermal contact with a first heat sink fin set;
    a second heat sink in thermal contact with a second heat sink fin set;
    a mounting plate having an inlet cut out and an outlet cut out therethrough and a first cut out and a second cut out therethrough, whereby when assembled, the first and second heat sinks are secured to and the first and second heat sink fin sets protrude inwardly through the first and second cut outs, respectively; and
    a cooling plate having a cooling chamber, a dividing wall and an outer mating surface and a third heat sink fin set and a fourth heat sink fin set thereon, whereby the third and fourth heat sink fin sets are on opposite areas of the dividing wall and correspond to the first and second heat sink fin sets, respectively, and whereby when assembled, the mounting plate is secured to the outer mating surface and rests flush on the dividing wall, defining a first flow channel area, a second flow channel area and a third flow channel area of the cooling chamber, wherein the first flow channel area is shaped like a funnel at the inlet cut out and extends to an end of the dividing wall and the first heat sink fin set and extends within the third heat sink fin set, the second flow channel area is shaped like a dogleg at the outlet cut out and extends to an end of the dividing wall and the second and fourth heat sink fin sets and the third flow channel area communicates with the first and second flow channel areas, respectively.

2. The vehicle electronic control unit water block of claim 1, wherein the first and second heat sinks and first and second heat sink fin sets, respectively, are integrally formed, whereby the first and second heat sink fin sets are formed by skiving.

3. The vehicle electronic control unit water block of claim 1, wherein the first, second, third, and fourth heat sink fin sets each comprise a plurality of longitudinal and parallel corrugations defining a plurality of heat sink fin flow channels therebetween, respectively, and the first and third heat sink fin sets extend from the end of the dividing wall to a side wall of the cooling chamber of the first flow channel area and the second and fourth heat sink fin sets extend from the end of the dividing wall to a side wall of the cooling chamber of the second flow channel area.

4. The vehicle electronic control unit water block of claim 1, wherein the shape of the first heat sink fin set is L-shaped and the shape of the third heat sink fin set is L-shaped, whereby when assembled, a perpendicular end of the third heat sink fin set extends partially into the third flow channel area, whereby a cooling liquid flow distance of the third heat sink fin set is greater than a cooling liquid flow distance of the first heat sink fin set, increasing cooling liquid flow rate at an end thereof.

5. The vehicle electronic control unit water block of claim 1, wherein the first and second cut outs of the mounting plate further comprise an elevated perimeter therearound, respectively, and the cooling plate further comprises a first lift plate and a second lift plate thereon, wherein the shapes of the first and second lift plates correspond to the shapes of the first and second heat sink fin sets, respectively, and the thicknesses of the first and second lift plates correspond to the elevation of the elevated perimeters of the first and second cut outs, respectively.

6. The vehicle electronic control unit water block of claim 5, wherein the first and second heat sinks and first and second heat sink fin sets are formed by folding and are affixed to the first and second lift plates, respectively.

7. The vehicle electronic control unit water block of claim 1, further comprising a frame, whereby the vehicle electronic control unit water block is configured to be fastened thereto.

* * * * *